United States Patent
Imam et al.

(10) Patent No.: US 6,773,997 B2
(45) Date of Patent: Aug. 10, 2004

(54) METHOD FOR MANUFACTURING A HIGH VOLTAGE MOSFET SEMICONDUCTOR DEVICE WITH ENHANCED CHARGE CONTROLLABILITY

(75) Inventors: Mohamed Imam, Tempe, AZ (US); Joe Fulton, Chandler, AZ (US); Zia Hossain, Tempe, AZ (US); Masami Tanaka, Fukushima (JP); Taku Yamamoto, Ishidou-machi (JP); Yoshio Enosawa, Miyagi-ken (JP); Katsuya Yamazaki, Monden-machi (JP); Evgueniy Stefanov, Vieille Toulouse (FR)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 09/917,731

(22) Filed: Jul. 31, 2001

(65) Prior Publication Data

US 2003/0027396 A1 Feb. 6, 2003

(51) Int. Cl.$^7$ .............................. H01L 21/336
(52) U.S. Cl. ................ 438/286; 438/301; 438/306
(58) Field of Search ................... 438/301, 306, 438/286

(56) References Cited

U.S. PATENT DOCUMENTS

| | | | | |
|---|---|---|---|---|
| 4,717,679 A | * | 1/1988 | Baliga et al. | 438/237 |
| 4,914,047 A | * | 4/1990 | Seki | 148/DIG. 126 |
| 5,072,268 A | * | 12/1991 | Rumennik | 257/378 |
| 5,162,883 A | * | 11/1992 | Fujihira | 257/139 |
| 5,258,636 A | * | 11/1993 | Rumennik et al. | 257/339 |
| 5,294,824 A | * | 3/1994 | Okada | 257/409 |
| 5,311,051 A | * | 5/1994 | Tukizi | 257/409 |
| 5,328,867 A | * | 7/1994 | Chien et al. | 148/DIG. 118 |
| 5,447,876 A | * | 9/1995 | Moyer et al. | 438/105 |
| 5,521,105 A | * | 5/1996 | Hsu et al. | 438/197 |
| 6,087,232 A | * | 7/2000 | Kim et al. | 438/289 |
| 6,168,983 B1 | * | 1/2001 | Rumennik et al. | 438/188 |
| 6,312,996 B1 | * | 11/2001 | Sogo | 438/298 |
| 6,346,448 B1 | * | 2/2002 | Kobayashi | 438/303 |
| 6,399,468 B2 | * | 6/2002 | Nishibe et al. | 438/301 |
| 6,448,625 B1 | * | 9/2002 | Hossain et al. | 257/493 |
| 6,552,393 B2 | * | 4/2003 | Murakami | 257/343 |
| 2001/0036694 A1 | * | 11/2001 | Kikuchi et al. | 438/197 |
| 2002/0072186 A1 | * | 6/2002 | Evans | 438/306 |
| 2002/0125530 A1 | * | 9/2002 | Imam et al. | 257/343 |
| 2002/0130336 A1 | * | 9/2002 | Imam et al. | 257/335 |

* cited by examiner

Primary Examiner—John F. Niebling
Assistant Examiner—Angel Roman

(57) ABSTRACT

A high voltage MOSFET device (100) has an nwell region (113) with a p-top layer (108) of opposite conductivity formed to enhance device characteristics. The p-top layer is implanted through a thin gate oxide, and is being diffused into the silicon later in the process using the source/drain anneal process. There is no field oxide grown on the top of the extended drain region, except two islands of field oxide close to the source and drain diffusion regions. This eliminates any possibility of p-top to be consumed by the field oxide, and allows to have a shallow p-top with very controlled and predictable p-top for achieving low on-resistance with maintaining desired breakdown voltage.

8 Claims, 10 Drawing Sheets

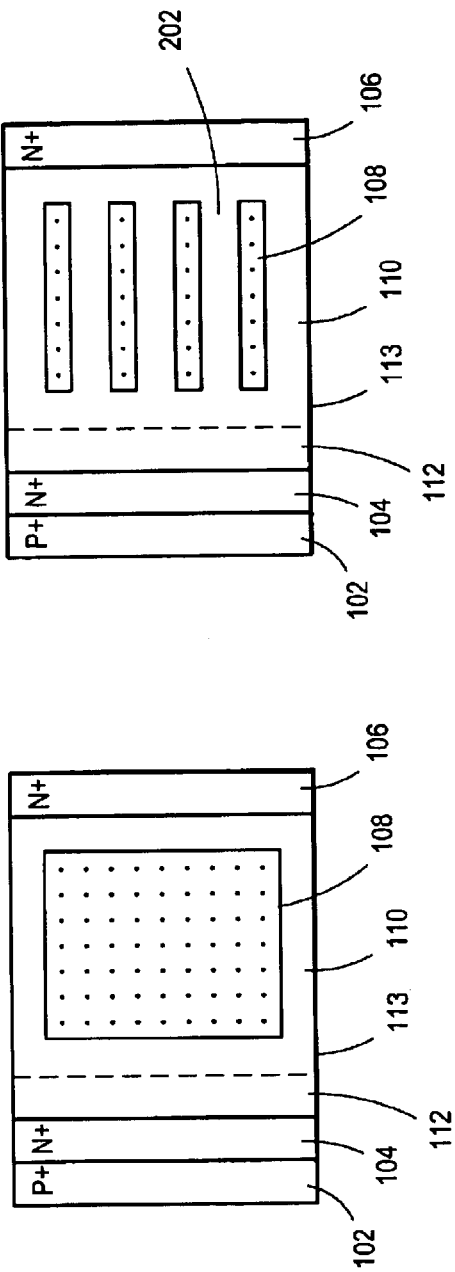
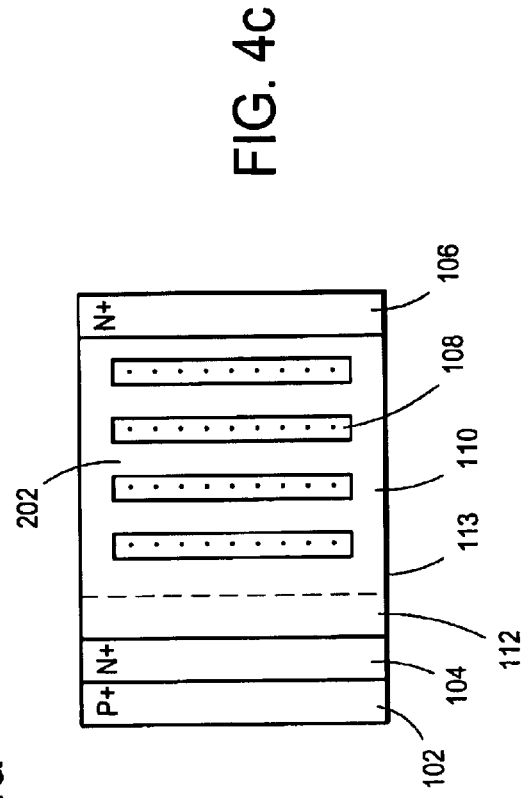
FIG. 4a  FIG. 4b  FIG. 4c

METHOD FOR MANUFACTURING A HIGH VOLTAGE MOSFET SEMICONDUCTOR DEVICE WITH ENHANCED CHARGE CONTROLLABILITY

BACKGROUND OF THE INVENTION

The present invention relates to high voltage MOSFET semiconductor devices and more specifically to a method for manufacturing a high voltage MOSFET semiconductor device with enhanced charge controllability.

When designing high voltage metal oxide semiconductor (MOS) devices two criteria must be kept in mind. First, the semiconductor device should have a high breakdown voltage ($V_{BD}$). Second, the semiconductor device, when operating, should have a low on-resistance ($RDS_{ON}$). One problem is that techniques and structures that tend to maximize breakdown voltage tend to adversely affect on-resistance and vice versa.

Different designs have been proposed to create semiconductor devices with acceptable combinations of breakdown voltage and on-resistance. One such family of semiconductor devices is fabricated according to the reduced surface field (RESURF) principle. Semiconductor devices with RESURF typically utilize an extended drain region, such as an nwell, to support high off-state voltage, i.e. an increase in breakdown voltage, $V_{BD}$. Such RESURF semiconductor devices can have a charge in the drain area of about $1 \times 10^{12}$ atoms/cm$^2$ before avalanche breakdown occurs. The charge sets up a low on-resistance since on-resistance is inversely proportional to the charge in the extended drain region.

To accomplish RESURF principle, some semiconductor devices utilize a top layer of a conductivity type opposite the extended drain region, such as a p-top layer, inside the extended drain region. The p-top layer allows the extended drain region to have approximately double the charge as compared to previous designs, which in turn decreases the on-resistance significantly. The p-top layer also depletes the extended drain region when the extended drain region is supporting high voltage, thus allowing for high breakdown voltage.

In the prior art, a thick layer of field oxide or other dielectric material, on the order of 1 micron in thickness, is formed along the drift region overlying the entire p-top layer region. Originally, the thick layer of field oxide was grown on the extended drain region to reshape the electric field distribution, commonly known as enhanced field plate effect, especially in the source and drain regions. The thick layer of field oxide also serves to protect the semiconductor device from damage by mobile ions or impurities.

However, it has been shown that the field oxide layer tends to consume the p-top layer. Since it is difficult to predict how much the p-top layer will be consumed by the growth of the field oxide layer, it makes the formation of the p-top layer in the extended drain region uncontrollable and unpredictable. If the p-top layer is consumed considerably, it would be difficult to deplete the extended drain region as effectively as required.

One solution is to increase the thickness of the p-top layer which will leave some p-top layer remaining even after partial consumption by the field oxide layer. However, the top portion of the extended drain region beneath the field oxide layer has a high concentration of dopants and therefore gives a low on-resistance. By increasing the thickness of the p-top layer, less of the high concentration underneath the p-top in the extended drain region is available, which will cause an increase in on-resistance.

BRIEF DESCRIPTION OF THE DRAWINGS

For a more complete understanding of the present invention and advantages thereof, reference is now made to the following description, taken in conjunction with the following drawings:

FIGS. 4a, 4b and 4c are simplified cross-sectional top views of the semiconductor device with different arrangements of the p-top layers;

DETAILED DESCRIPTION OF THE DRAWINGS

The present invention relates to a high voltage MOSFET semiconductor device that has a high breakdown voltage and low on-resistance. While the discussions described below are using n-channel devices, the discussion also pertains to p-channel devices, which may be formed by reversing the conductivity of the described regions and layers. The semiconductor device overcomes the disadvantages discussed previously by eliminating the thick field oxide layer that is formed over the p-top layer. By eliminating the thick oxide layer, the formation of the p-top layer can be controlled better, thereby achieving the desired device performance.

Figure 1:
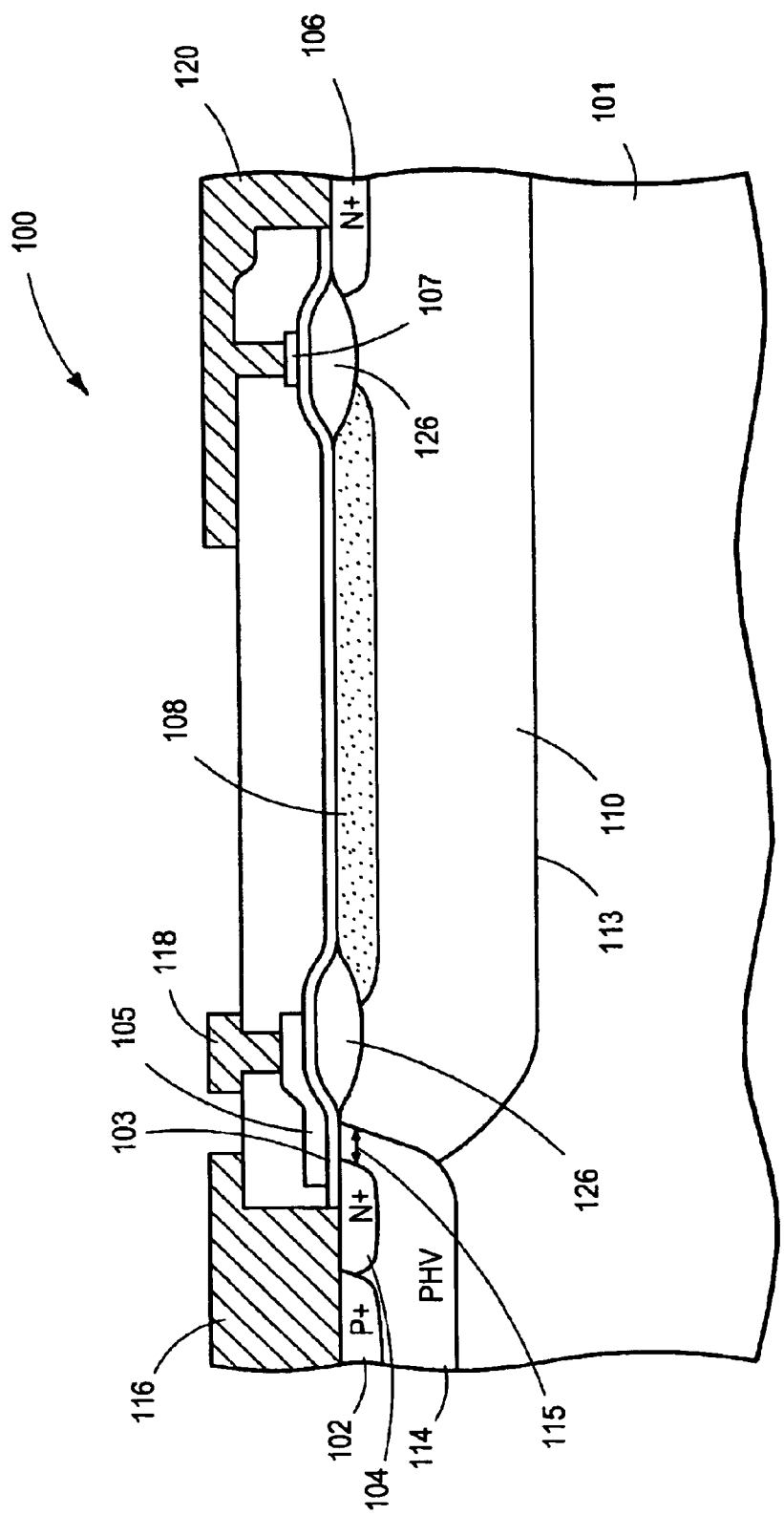
FIG. 1 is a cross-sectional side view of a high voltage MOSFET semiconductor device.

FIG. 1 is a cross-sectional side view of an exemplary n-channel MOSFET semiconductor device 100. Illustrated is a lightly doped p-type substrate region 101. An N+ source diffusion region 104 is formed at the top surface of substrate region 101. A P+ diffusion region 102 is formed laterally adjacent to N+ source diffusion region 104. The P+ diffusion region 102 increases the integrity of the source to substrate connection as well as reducing the semiconductor device's susceptibility to parasitic bipolar effects. Associated with N+ source diffusion region 104 and P+ diffusion region 102 is a source electrode 116, which provides electrical contact to N+ source diffusion region 104 and P+ diffusion region 102.

A thin insulating layer 103, comprising silicon dioxide or other insulating dielectric material, is formed over the top surface of substrate 101. A gate region 105 is formed over insulating layer 103 from a conductive material such as polysilicon. A gate electrode 118 provides electrical contact to gate region 105.

An N+ drain diffusion region 106 is formed at the top surface of substrate 101 spaced away from source diffusion region 104 and connected electrically to drain electrode 120. A drain flap 107 of conductive material such as polysilicon is formed on the top of a thick field oxide island 126 in electrical contact with drain electrode 120. The conductive material in drain flap 107 redistributes the electric field in the proximate area, commonly known as the field plate effect. Source, gate, drain electrodes 116, 118, 120 may comprise of a number of conductive metals or metal alloys.

An optional diffused P region 114 may be formed in substrate 101 to enclose P+ diffusion region 102 and N+ source diffusion region 104. The diffused P region 114 is a high voltage P-region (PHV), which reduces the semiconductor device's susceptibility to drain-to-source punch-through as well as providing a threshold voltage. A channel region 115 exists laterally from source diffusion region 104 to the end of diffused p region 114.

An nwell region 113 is formed in substrate 101 extending from channel region 115 to N+ drain diffusion region 106. In some embodiments, nwell region 113 can also be extended under PHV region 114. In nwell 113, the charge can approach $2 \times 10^{12}$ atoms/cm$^2$.

A p-top layer 108 is formed within nwell 113 for charge balancing. P-top layer 108 is typically located near the top of nwell 113. P-top layer 108 allows for downward depletion into the extended drain region of nwell 113 when semiconductor device 100 is operating under voltage blocking mode. This feature, along with the upward depletion from substrate 101 below nwell 113, allows for a high breakdown voltage. The double-depletion effect allows for increased doping in nwell 113 for achieving lower on-resistance. While an nwell region 113 is shown, the region may also be an n-epi layer formed by epitaxial growth.

In the prior art, a relatively thick layer of field oxide (approximately 1 micron thick) is grown over most if not all of the top of the nwell region including over the area where the p-top layer is implanted. The thick layer of field oxide has been used to protect the semiconductor device from mobile impurities that could penetrate the device and degrade its performance. The thick field oxide can also be used for enhanced field plate effect in certain areas.

As a feature of the present invention, the thick layer of field oxide over the entire nwell region can be eliminated by using islands of field oxide 126 as described below. The placement of p-top layer 108 at or near the surface of the extended drain region of nwell 113 can protect semiconductor device 100 from mobile impurities.

As shown in FIG. 1, semiconductor device 100 includes p-top layer 108 without a thick overlaying field oxide layer. Semiconductor device 100 has an island of thick field oxide or other dielectric material 126 formed under gate contact 118 at the top surface of nwell region 113. A second island of thick field oxide island or other dielectric material 126 is formed at the top surface of nwell region 113 adjacent to N+ drain diffusion region 106 and laterally separated from the first island of field oxide by p-top layer 108. The islands of field oxide are approximately 1 micron in thickness. There is no thick layer of field oxide over the entire p-top layer 108. The presence of p-top layer 108 near the surface of nwell 113 protects semiconductor device 100 from mobile impurities. The field oxide islands 126, along with gate and drain electrodes 118 and 120, polysilicon gate 105 and drain flap 107 redistribute the electric fields in these areas to achieve the desired field plate effect.

In an alternate embodiment, an extension of the thin insulating layer 103, less than 1000 angstroms in thickness, may overlie p-top layer 108. The extended insulation layer 103 is less than the thickness of the islands of field oxide 126, and less than the thickness of the field oxide layer as found in the prior art overlying most if not all of the nwell. The extended insulating layer 103, which also acts as a gate oxide, is formed before the formation of p-top layer 108. P-top layer 108 is implanted through the extended insulating layer 103.

The p-top layer 108 without a thick overlying layer of field oxide results in several advantages over the prior art. Since a thick field oxide layer reacts with and consumes p-top layer 108, by eliminating the thick field oxide layer, a more predictable p-top layer 108 can be formed. The p-top layer 108 allows for downward depletion while blocking voltage leading to a higher breakdown voltage. Additionally, by eliminating the thick field oxide layer, p-top layer 108 can be made shallow. This results in higher concentration of dopants on the surface of nwell 113, resulting in lower on-resistance.

Figure 2:
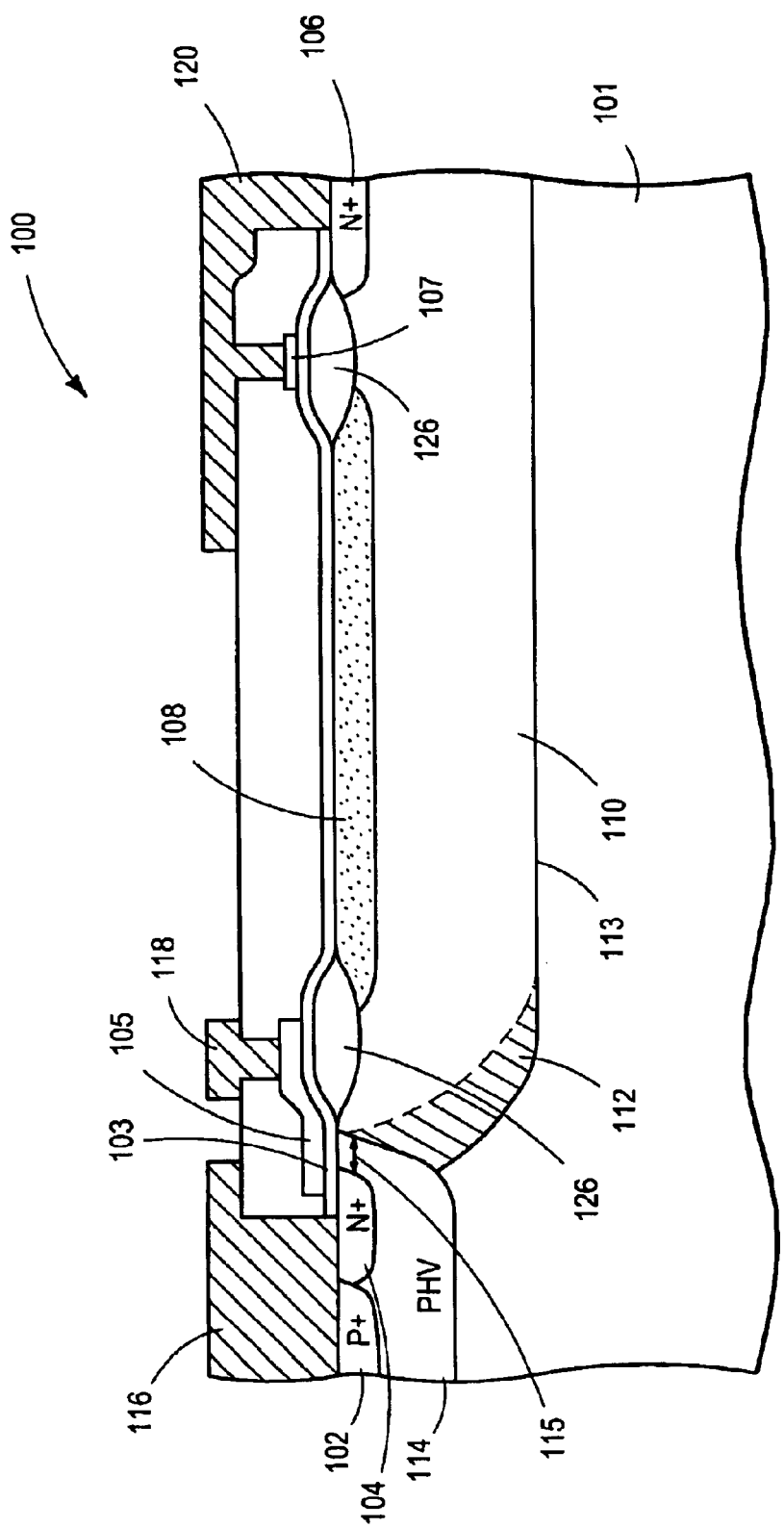
FIG. 2 is a cross-sectional side view of the semiconductor device with an enhanced nwell.

FIG. 2 is a cross sectional side view of semiconductor device 100 as in FIG. 1 but having an enhanced nwell. All other reference numbers and features in FIG. 2 correspond to FIG. 1. Nwell 113 comprises a first region 110 of high dopant concentration offset from a second region 112 of lower dopant concentration. The regions are formed by performing two separate nwell implants. The first implant is a relatively low concentration implant. Then, a second implant of higher concentration is performed. Alternatively, the higher concentration implant can be performed first and the lower concentration implant can be performed second. The second implant is laterally offset from the first implant by a certain amount to form the two separate regions. The embodiment of FIG. 2 allows for a lower concentration of dopants under gate region 105 next to channel region 115 and a higher concentration in nwell drift region 113 and N+ drain diffusion regions 106. The lower concentration in gate 105 increases the depletion region extension into nwell 113, which helps prevent premature breakdown that may occur due to the critical field at the surface of semiconductor device 100 close to gate 105. On the other hand, the higher concentration in nwell drift region 113 results in lower on-resistance.

Figure 3:
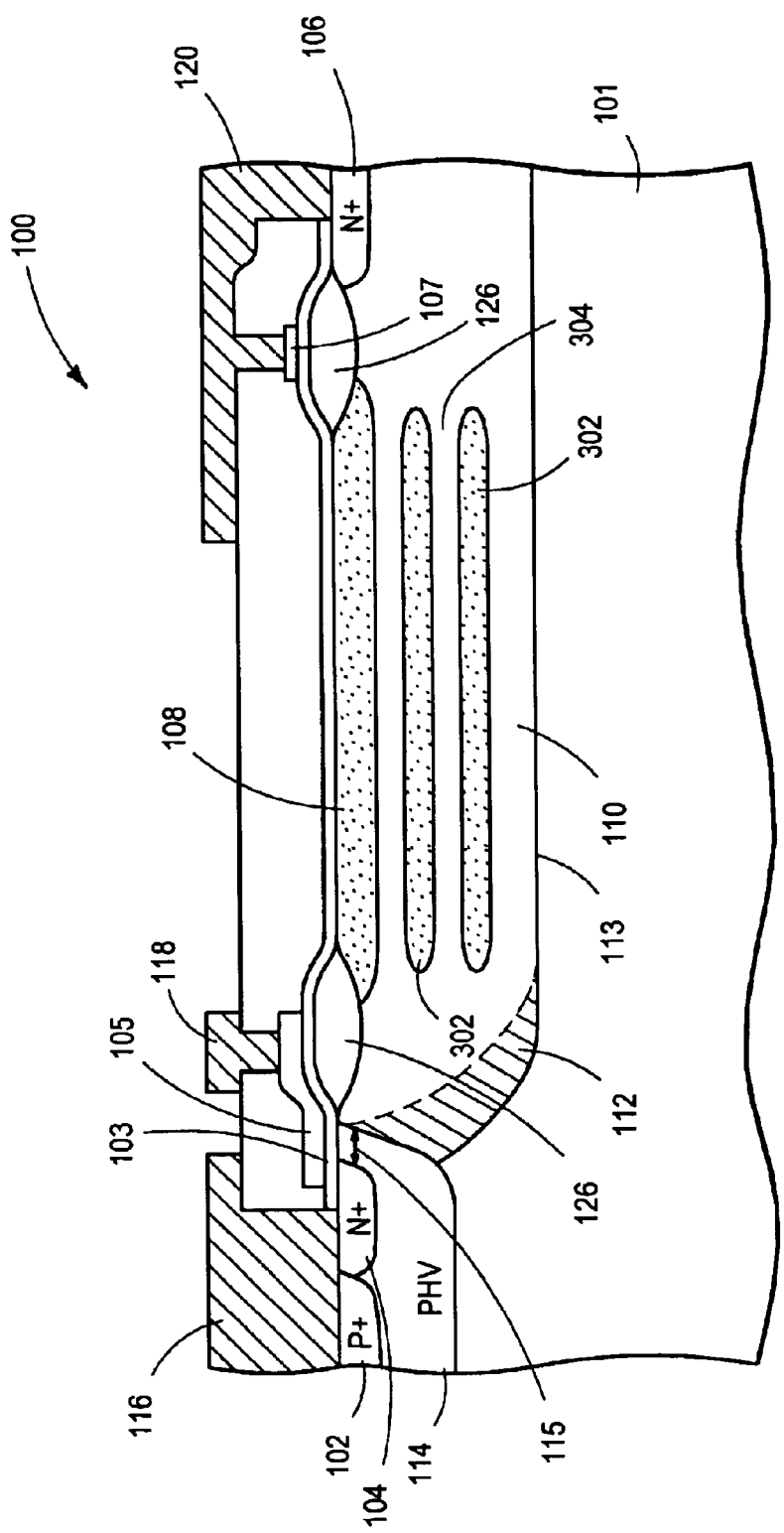
FIG. 3 is a cross-sectional side view of the semiconductor device with multiple P regions inside the nwell.

FIG. 3 is a cross-sectional side view of semiconductor device 100 with multiple p-regions in nwell 113. All other reference numbers and features in FIG. 3 correspond to FIGS. 1 and 2. As seen in FIG. 3, additional p-regions 302 are formed within nwell 113 and below p-top layer 108. The p-regions 302 are formed, for example, by high-energy ion implantation resulting in nwell 113 having multiple p-regions 302 separated by conductive nwell regions 304. The nwell conductive channels 304 allow for a lower on resistance by allowing for a much larger charge to be supported in each conductive channel 304. The nwell conductive channels 304 will be fully depleted by the multiple p- regions 302 for higher breakdown voltage.

FIGS. 4a, 4b and 4c are simplified cross-sectional top views of semiconductor device 100. The top views in FIGS. 4a, 4b and 4c omit layers that are understood for purposes of clarity. Illustrated in FIG. 4a is N+ source diffusion region 104, the adjacent P+ diffusion region 102, the N+ drain diffusion region 106 and p-top layer 108 which, in this embodiment, is one solid p-top layer. The P-top layer 108 overlies nwell 113, which, in this illustration, comprises of the first region 110 of high dopant concentration and the second region 112 of low dopant concentration. P-top layer 108 is formed in nwell 113. As discussed in conjunction with FIG. 3, there can be multiple p-regions under p-top layer 108. The P-top layer 108 does not necessarily have to be at the top but can stay below the surface of nwell 113.

FIG. 4b illustrates semiconductor device 100 with p-top layer 108 as multiple "stripes" of p-top material each one separated by a conductive nwell channel region 202 which is parallel to current flow (current will flow from the source to the drain). FIG. 4b also illustrates nwell 113 having a first region 110 of high dopant concentration and a second region 112 of lower dopant concentration.

FIG. 4c is similar to FIG. 4b except the "stripes" of p-top layer 108 are aligned perpendicular to current flow. Again, nwell 113 is illustrated having a first region 110 of high dopant concentration and a second region 112 of low dopant concentration. While FIGS. 4b and 4c show p-top as "striped" regions, other shapes and patterns of p-top can also be adopted. Examples include a plurality of squares, checker-board, circular and polygonal areas of p-top layer 108.

Figure 5:
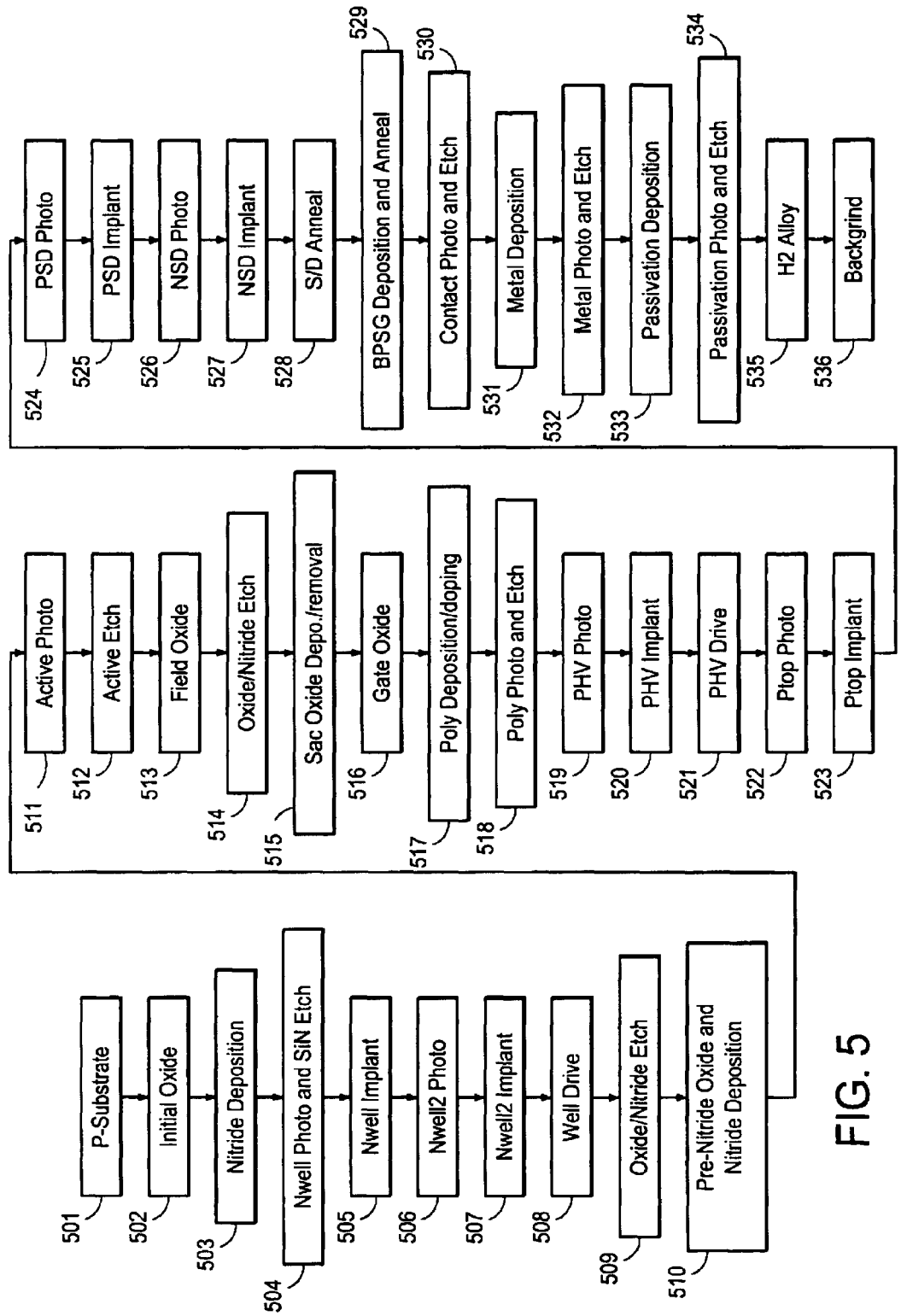
FIG. 5 is a flowchart outlining the process steps in manufacturing of the semiconductor device.

FIG. 5 is a flowchart illustrating the manufacturing steps of the n-channel MOSFET semiconductor device 100. Initially, in step 501, a p-type substrate 101 is provided. Next, in step 502, an initial layer of oxide is grown on the top surface of the substrate. The oxide layer is then followed by the deposition of silicon nitride in step 503 to protect the surface of the substrate from damage during processing, and for photolithographic purposes. In step 504, a photolithographic step is performed to form a first nwell opening. An nwell mask is used to etch away the silicon nitride in the area where the first nwell implant is to be made.

In steps 505–506, an initial nwell implant, typically using phosphorus or arsenic as a dopant, is made through the initial oxide layer using the nwell opening produced in step 501–504. The dose of the nwell implant depends on whether the semiconductor device will have an enhanced nwell region with a first region of high dopant concentration and a second region of low dopant concentration or if the nwell is to be a single nwell region. If the region is to be a single region, the nwell implant is done once, with a typical dose of $5 \times 10^{12}$ to $6.5 \times 10^{12}$ atoms/cm$^2$. If instead, the enhanced nwell region requires two implants, the first nwell implant can be either of high dopant concentration ($4.0$–$5.0 \times 10^{12}$ atoms/cm$^2$) or low dopant concentration ($1$–$1.5 \times 10^{12}$ atoms/cm$^2$).

In step 507, which is the optional second nwell implantation, a second nwell masking step is performed to create the opening for the second nwell implant. The second nwell opening is offset from the first nwell opening. The second nwell implant is also performed through the initial oxide. If the first nwell implant dose is of high dopant concentration, the second nwell implant dose will be of a lower concentration. If the first nwell implant is of a low concentration, the second nwell implant will be of high concentration. First nwell region and second nwell region are offset from one another.

Figure 6:
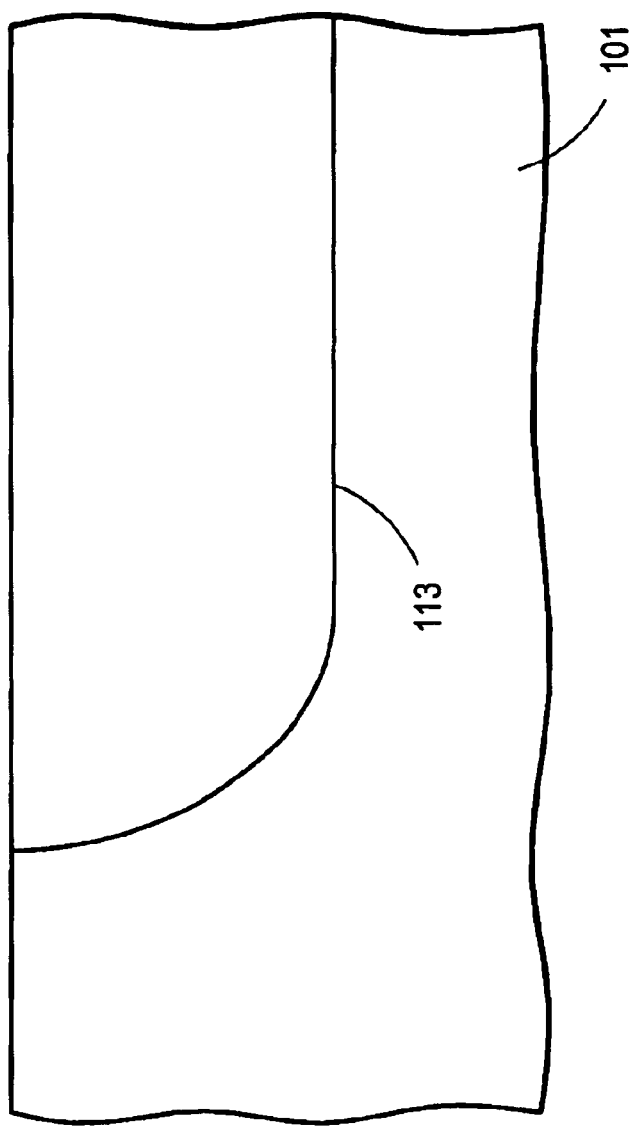
FIGS. 6–10 are cross-sectional views of the semiconductor device after certain manufacturing steps.

In steps 508–512, a high temperature diffusion process is performed to diffuse the nwell 113 (or nwells) implants into the substrate. The oxide layer and the remaining silicon nitride are removed from the semiconductor device prior to the creation of the field oxide region. FIG. 6 illustrates semiconductor device 100 after step 512.

Figure 7:
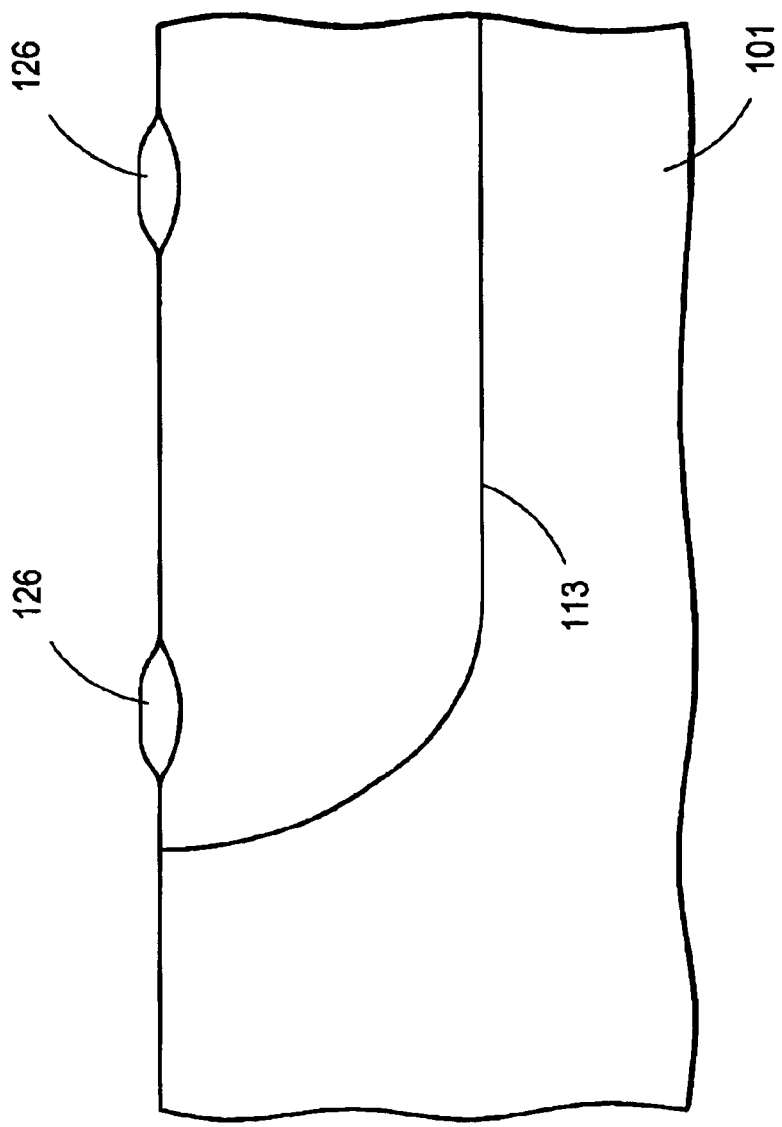

In steps 513–515, a layer of pad oxide is deposited on the semiconductor device, followed by depositing a layer of nitride. An active area mask is used to define where the field oxide will be grown. The mask will be used to etch the nitride layer, which defines where the field oxide will be grown. The nitride layer will protect the areas where there will be no field oxide, and later in the process, p-top will be implanted through this non-field oxide area. For the illustrated semiconductor device, a first region of field oxide 126 is grown in the nwell near the source region. A second region of field oxide 126 is grown near the drain diffusion region and laterally separated from the first region. Therefore, there will be no field oxide in the extended nwell region, except two field oxide islands will remain in the vicinity of source and drain diffusion regions. A nitride/oxide etch removes the nitride and oxide prior to the formation of gate oxide. FIG. 7 illustrates semiconductor device 100 after step 515.

Figure 8:
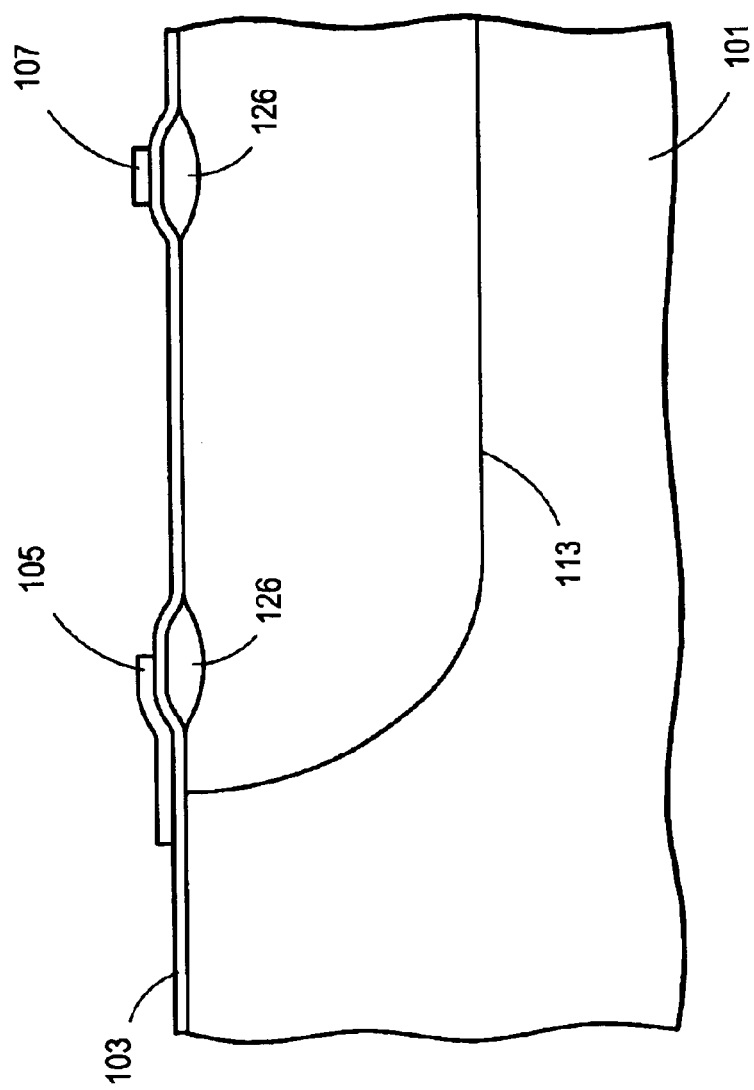

In steps 516–519, a layer of gate oxide is formed over the semiconductor device. First, a sacrificial oxide layer is deposited and etched off for cleaning purposes, right before gate oxide 103 is grown. Next, poly-silicon or other conductive material is deposited to form both poly-silicon gate 105 and poly-silicon flap 107 over field oxide region 126 adjacent to N+ drain region. FIG. 8 illustrates the semiconductor device after step 519.

In steps 520–522, a high voltage p region (PHV) is implanted and diffused for creating the channel for the semiconductor device (channel area is the outdiffusion area of PHV underneath the poly region), and also used for body contact. PHV region 114 also prevents punch-through from nwell region 113 to N+ source diffusion region 104. A PHV photolithographic step is performed with a mask that has openings where the PHV region 114 is to be implanted. The PHV is typically done self aligned to the polysilicon gate. PHV region 114 is laterally disposed from nwell region 113. The PHV implant is typically done using boron as a dopant, and then a diffusion cycle is performed to diffuse the PHV region to a desired depth.

Figure 9:
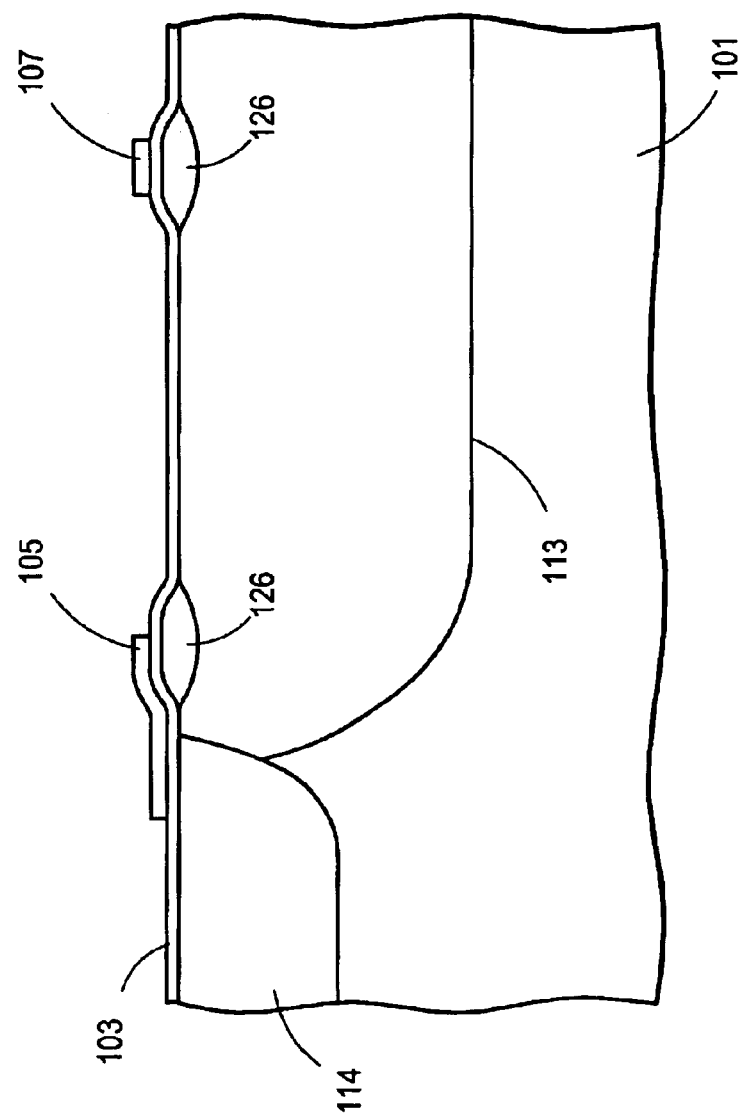

In steps 523–524, p-top layer 108 is formed. The p-top layer 108 is a p-region formed near the surface of the nwell region, between the islands of field oxide 126 in order to provide for double RESURF in the nwell region 113. A photolithographic step is performed with a p-top mask that provides for an opening where the p-top layer will be implanted. In this example, the opening will be in the nwell region between the islands of field oxide formed earlier. A p-top implant is performed through the gate oxide with boron as a dopant. At this time, no heat step is performed, but the p-top will be diffused further into the silicon by the subsequent source/drain annealing process. In an alternative embodiment, the p-top layer 108 can be implanted without a mask by using field oxide layers 126 to align the implant. FIG. 9 illustrates the semiconductor device after step 524.

Figure 10:
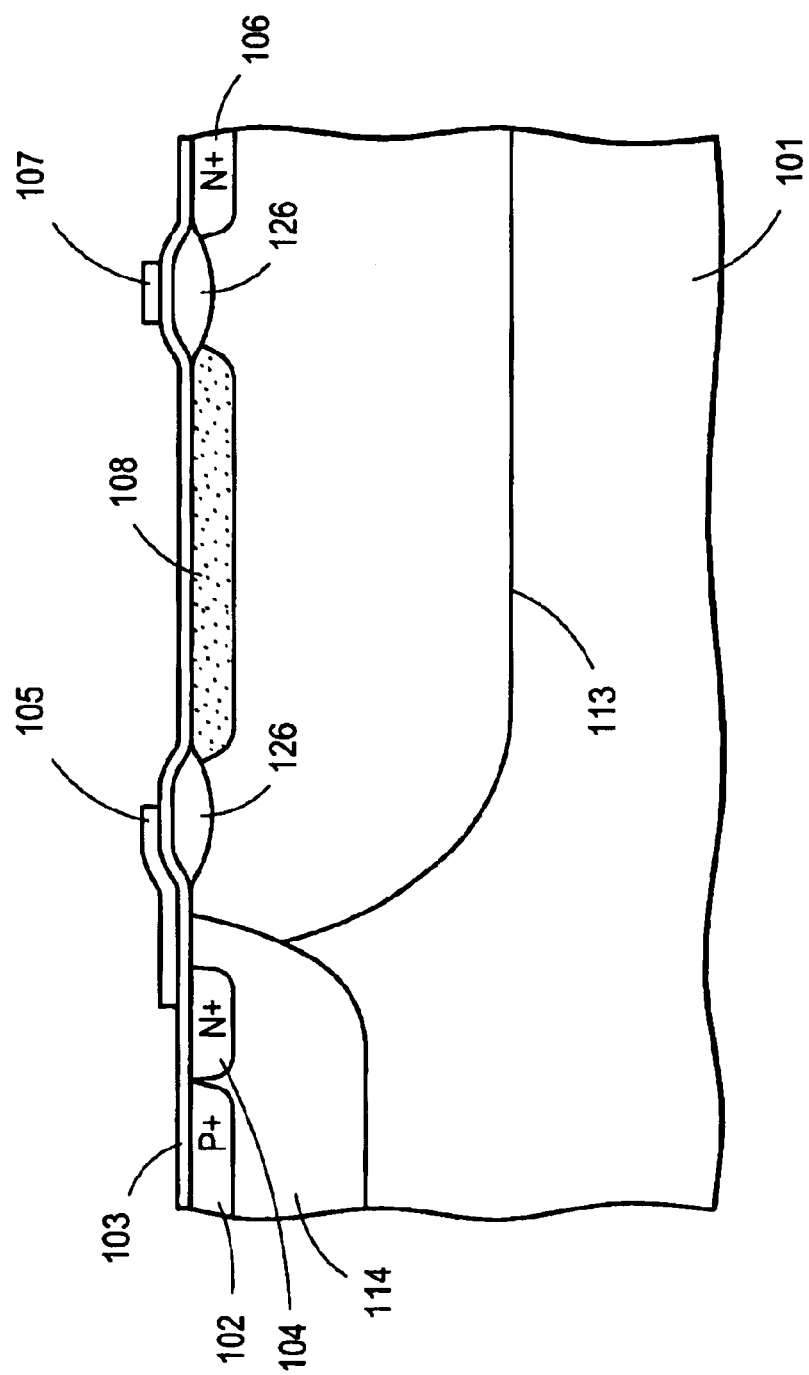

In step 525, the source and drain diffusion regions are created. First, a photolithographic step is performed using a mask that provides openings where a P+ diffusion region 102 will be formed. In this embodiment, the P+ diffusion region 102 is formed in PHV region 114 by implantation. Next, a source/drain photolithographic step is performed to create the openings for the N+ diffusion regions. One of the N+ diffused regions is the source diffusion region 104, formed in the PHV region 114 adjacent to the p+ diffused region, and the other N+ diffused region is the drain diffusion region 106 formed at the end of the extended nwell region. After the implants are completed, an annealing process occurs that diffuses P+ diffusion region 102, N+ source diffusion region 104, N+ drain diffusion region 106, and p-top layer 108. The source/drain anneal process causes the p-top layer 108 to diffuse a small amount into the nwell region. FIG. 10 illustrates the semiconductor device at step 528 of the process.

Next, further steps 529–536 are performed to provide for the inter-layer dielectric (ILD) for contacts, metal layers, passivation and backgrind. These steps are conventional and well known.

By providing a single annealing step for p-top layer 108, the p-top layer is only diffused a small amount into nwell region 113. This allows for a shallower p-top layer 108 closer to the surface of the nwell region 113. Also, since there is no field oxide over p-top layer 108, the consumption of the p-top layer 108 by the field oxide is avoided, which results in a more predictable and controllable p-top layer 108.

Thus, it is apparent that there has been provided an improved semiconductor device. It should be understood that various changes, substitutions, and alterations can be made herein without departing from the spirit and scope of the present invention as defined by the following claims.

What is claimed is:

1. A method of making a semiconductor device comprising:
    providing a substrate 101, 114 having a surface and a diffused region of a second conductivity type PHV 114 for forming a channel 115 of the semiconductor device;
    forming a drain 106, 107, 110, 113 of a first conductivity type at the surface for electrically coupling a drain electrode to the channel; wherein the step of forming a drain further comprises
        forming a first area 110 of first dopant concentration by performing a first area implant, and
        forming a second area 112 of second dopant concentration different than the first dopant concentration by performing a second area implant 507, the second area implant is laterally offset from the first area;
    growing an oxide 103 less than one-thousand angstroms thick over the drain; and
    introducing dopants of a second conductivity type through the oxide between the channel and the drain electrode to form a first charge balancing layer 108 within the drain and at the surface.

2. The method of claim 1, further comprising introducing dopants of the second conductivity type through the oxide to form a second charge balancing layer 302 within the drain and under the first charge balancing layer.

3. The method of claim 2, further comprising forming a gate region 105 overlying the oxide.

4. The method of claim 1, further comprising forming a diffused region 114 of the first conductivity type.

5. The method of claim 4, further comprising forming a source diffusion region 102 in the diffused region of the first conductivity type.

6. The method of claim 1, further comprising forming a drain diffusion region 106 at the surface of the drain.

7. The method of claim 1, wherein introducing dopants includes the step of:
    disposing a first island of dielectric material (126) at a top of the substrate within the drain; and
    disposing a second island of dielectric material (126) at a top of the substrate, within the drain and laterally separated from the first island of dielectric material; and
    masking the dopants with the first and second islands to form the first charge balancing layer between the first and second islands of dielectric material.

8. The method of claim 7, wherein the first and second islands of dielectric material are formed to a thickness of greater than one micrometer.

* * * * *